United States Patent
Lee

(10) Patent No.: US 12,207,472 B2
(45) Date of Patent: Jan. 21, 2025

(54) SEMICONDUCTOR MEMORY DEVICE AND METHOD OF MANUFACTURING THE SAME

(71) Applicant: SK hynix Inc., Icheon-si (KR)

(72) Inventor: Hyun Ho Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 229 days.

(21) Appl. No.: 17/512,260

(22) Filed: Oct. 27, 2021

(65) Prior Publication Data

US 2022/0367486 A1   Nov. 17, 2022

(30) Foreign Application Priority Data

May 12, 2021   (KR) .................. 10-2021-0061376

(51) Int. Cl.
  *H10B 43/35*   (2023.01)
  *H10B 41/27*   (2023.01)
  *H10B 41/41*   (2023.01)
  *H10B 43/27*   (2023.01)

(52) U.S. Cl.
  CPC ............. *H10B 43/35* (2023.02); *H10B 41/27* (2023.02); *H10B 41/41* (2023.02); *H10B 43/27* (2023.02)

(58) Field of Classification Search
  CPC ........ H10B 43/35; H10B 41/27; H10B 43/27; H10B 41/41; H10B 43/10; H10B 43/20; H10B 63/84; H10B 43/50
  See application file for complete search history.

(56) References Cited

U.S. PATENT DOCUMENTS

| 2018/0240813 | A1* | 8/2018 | Lee | .................. | H10B 43/35 |
| 2019/0386022 | A1* | 12/2019 | Kim | ................. | H10B 43/27 |
| 2022/0020762 | A1* | 1/2022 | Son | .................. | H10B 43/10 |
| 2022/0149067 | A1* | 5/2022 | Hopkins | ............... | H10B 43/10 |

FOREIGN PATENT DOCUMENTS

| KR | 1020140063147 A | 5/2014 |
| KR | 1020180138380 A | 12/2018 |

* cited by examiner

*Primary Examiner* — Meiya Li
(74) *Attorney, Agent, or Firm* — WILLIAM PARK & ASSOCIATES LTD.

(57) ABSTRACT

A semiconductor memory device, and a method of manufacturing the same, includes a first stack and a second stack stacked on a semiconductor substrate in a cell region of the semiconductor memory device and a slit region of the semiconductor memory device adjacent to the cell region. The semiconductor memory device also includes a plurality of cell plugs at least partially passing through the second stack and the first stack of the cell region and extending in a vertical direction, a slit at least partially passing through the second stack and the first stack of the slit region, and a protective pattern disposed between the slit and dummy cell plugs adjacent to the slit among the plurality of cell plugs.

8 Claims, 14 Drawing Sheets

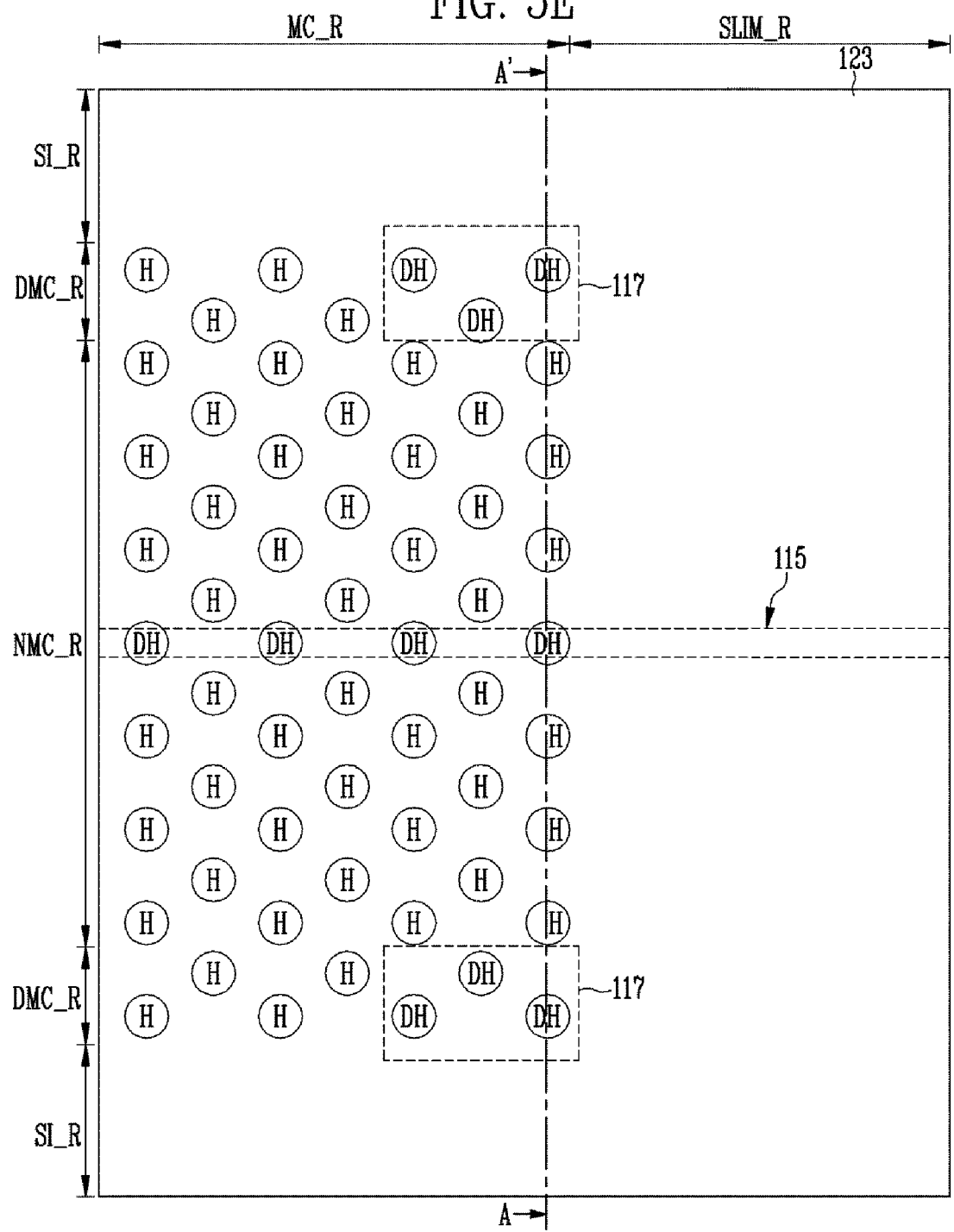

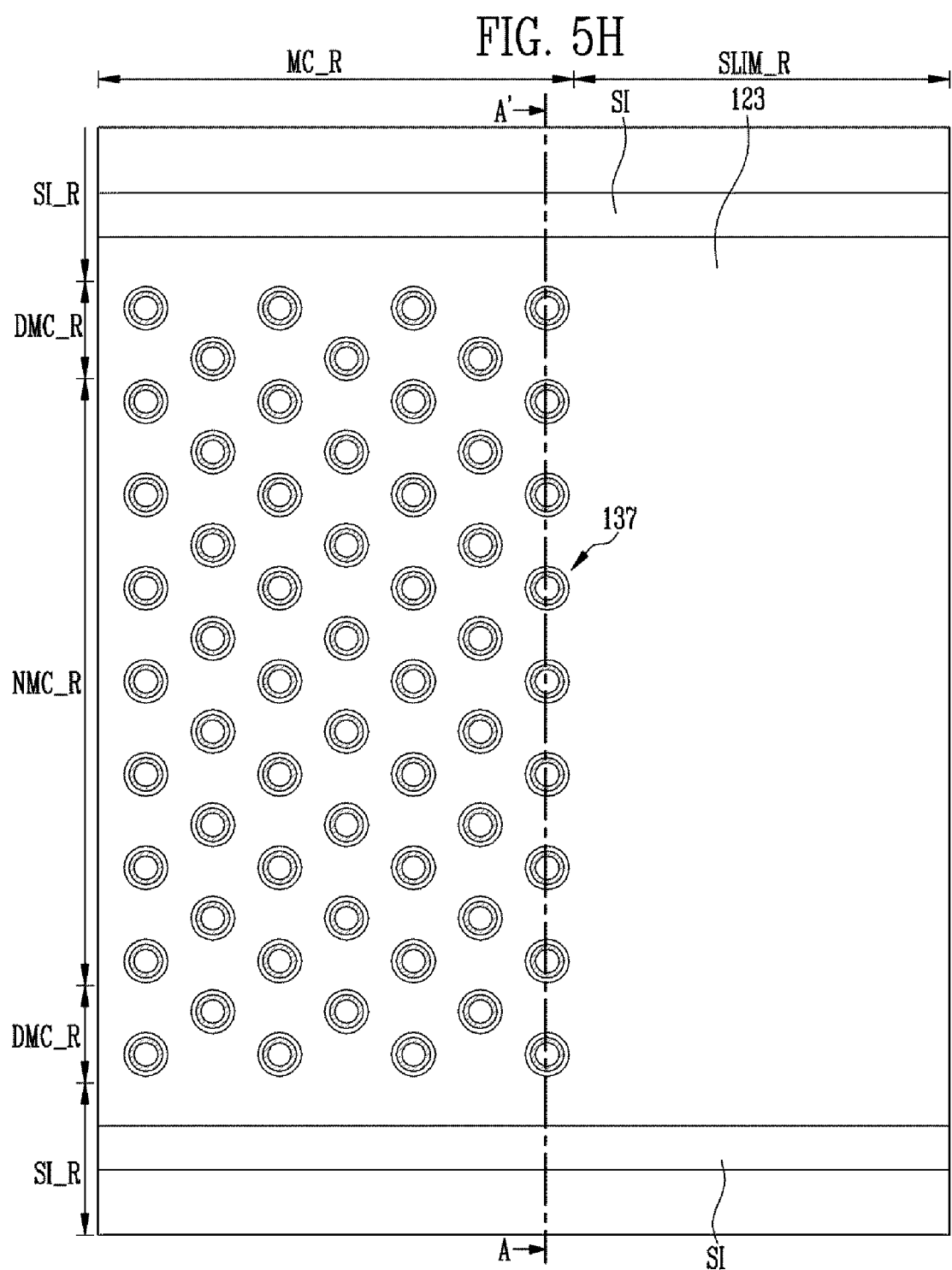

SEMICONDUCTOR MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2021-0061376, filed on May 12, 2021, in the Korean Intellectual Property Office, the entire disclosure of which is incorporated herein by reference.

BACKGROUND

1. Technical Field

The present disclosure relates to an electronic device, and more particularly, to a semiconductor memory device of a vertical channel structure and a method of manufacturing the same.

2. Related Art

A semiconductor memory device is a memory device that is implemented using a semiconductor such as silicon (Si), germanium (Ge), gallium arsenide (GaAs), or indium phosphide (InP). A semiconductor memory device is generally classified as a volatile memory device or a nonvolatile memory device.

A volatile memory device is a memory device in which stored data is lost when a power supply is cut off. A volatile memory device may include static RAM (SRAM), dynamic RAM (DRAM), synchronous DRAM (SDRAM), and the like. A nonvolatile memory device is a memory device that maintains stored data even when a power supply is cut off. A nonvolatile memory device may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. Flash memory is generally classified as NOR type or NAND type.

Recently, as the use of portable electronic devices increases, the use of nonvolatile semiconductor memory devices increases, and high integration and large capacity of semiconductor memory devices are required for portability and large capacity. For such high integration and large capacity, three-dimensional semiconductor memory devices have been proposed.

SUMMARY

An embodiment of the present disclosure is directed to a semiconductor memory device and a method of manufacturing the same capable of improving operation reliability by improving a bridge phenomenon of gate patterns adjacent to a slit.

According to an embodiment of the present disclosure, a semiconductor memory device includes a first stack and a second stack stacked on a semiconductor substrate of a cell region of the semiconductor memory device and a slit region of the semiconductor memory device adjacent to the cell region. The semiconductor memory device also includes a plurality of cell plugs at least partially passing through the second stack and the first stack in the cell region and extending in a vertical direction, a slit at least partially passing through the second stack and the first stack in the slit region, and a protective pattern disposed between the slit and dummy cell plugs adjacent to the slit among the plurality of cell plugs.

According to an embodiment of the present disclosure, a method of manufacturing a semiconductor memory device includes forming a first stack in which first interlayer insulating layers and first sacrificial layers are alternately stacked on a semiconductor substrate, the semiconductor memory device including a slit region, a dummy cell region, and a normal cell region. The method also includes removing the first stack from the dummy cell region by etching the first stack, and forming a protective pattern in a space where the first stack is removed, forming a second stack in which second interlayer insulating layers and second sacrificial layers are alternately stacked on an entire structure including the first stack and the protective pattern. The method further includes forming a plurality of cell plugs at least partially passing through the second stack and the first stack in the normal cell region, and forming at least one or more dummy cell plugs passing through the second stack and the protective pattern on the dummy cell region, and etching the second stack and the first stack on the slit region to form a slit.

According to an embodiment of the present disclosure, a method of manufacturing a semiconductor memory device includes stacking and forming a first interlayer insulating layer, a first source layer, a source sacrificial structure, a third source layer, and a first stack in which second interlayer insulating layers and first sacrificial layers are alternately stacked on a semiconductor substrate, the semiconductor memory device including a slit region, a dummy cell region, and a normal cell region. The method also includes removing the first stack from the dummy cell region by etching the first stack, and forming a protective pattern in a space where the first stack is removed, forming a second stack in which third interlayer insulating layers and second sacrificial layers are alternately stacked on an entire structure including the first stack and the protective pattern. The method further includes forming a plurality of cell plugs at least partially passing through the second stack, the first stack, the third source layer, and the source sacrificial structure in the normal cell region, and forming at least one or more dummy cell plugs passing through the second stack, the protective pattern, the third source layer, and the source sacrificial structure in the dummy cell region. The method additionally includes etching the second stack, the first stack, and the third source layer in the slit region to form a slit through which the source sacrificial structure is exposed.

According to an embodiment the present technology, a stack for forming a gate pattern of a source select transistor is removed by etching the stack in a memory cell region adjacent to a slit region, and a protective pattern is formed in a space where the stack is removed. Accordingly, because the gate pattern of the source select transistor is not formed in a region adjacent to a slit, a bridge phenomenon of the gate patterns adjacent to the slit does not occur even though a lower portion of the slit is bent and etched during an etching process for forming the slit.

BRIEF DESCRIPTION OF THE DRAWINGS

FIGS. 5A to 5I are cross-sectional views and plan views of a semiconductor memory device illustrating a method of manufacturing the semiconductor memory device according to an embodiment of the present disclosure.

DETAILED DESCRIPTION

Figure 1:
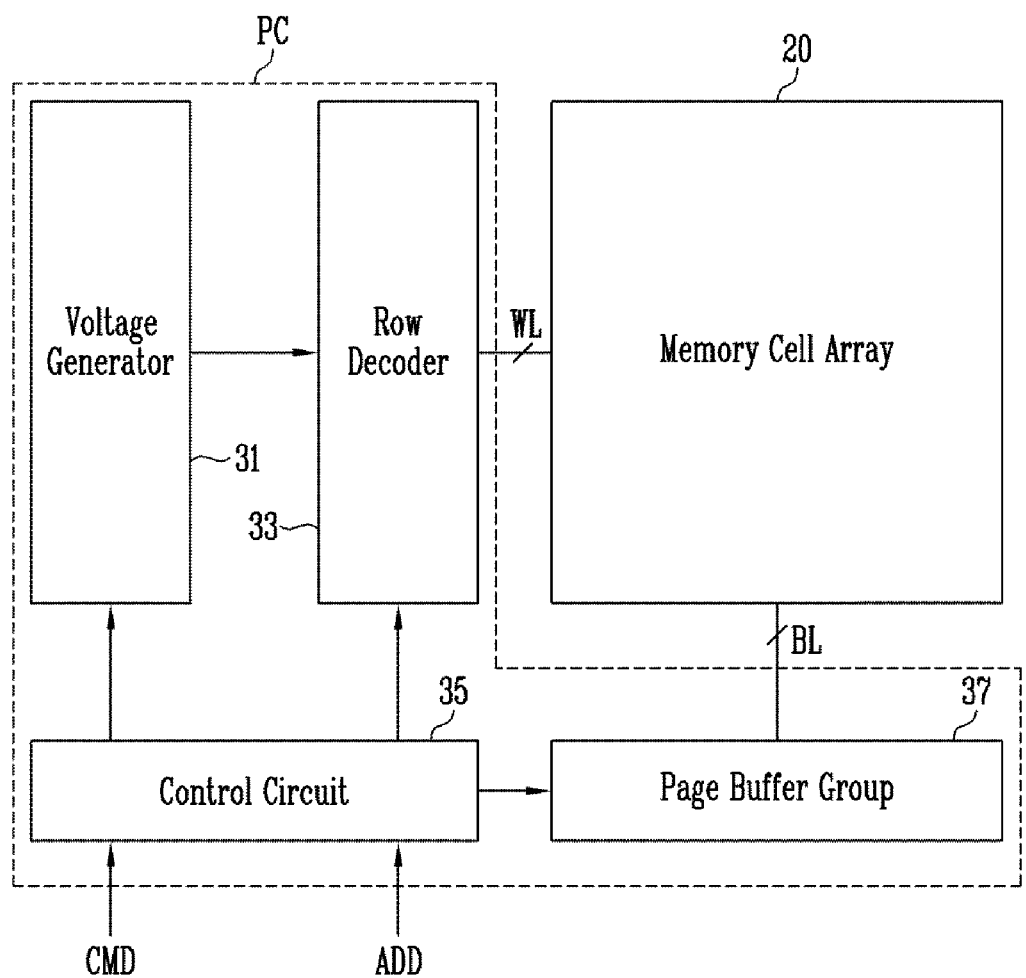
FIG. 1 is a block diagram illustrating a semiconductor memory device according to an embodiment of the present disclosure.

Hereinafter, an embodiment of the present disclosure is described. In the drawings, the thickness and the distance are expressed for convenience of description, and may be exaggerated relative to the actual physical thickness. In describing the present disclosure, known configurations irrespective of the gist of the present disclosure may be omitted. It should be noted that in adding reference numerals to the components of each drawing, the same components have the same number if possible, even though the same components are shown in different drawings.

Throughout the specification, in a case in which a portion is "connected" to another portion, the case includes not only a case in which the portion is "directly connected" to the other portion but also a case in which the portion is "indirectly connected" to the other portion with another element interposed therebetween. Throughout the specification, in a case in which a portion includes a component, the case means that the portion may further include other components without excluding other components unless specifically stated otherwise.

FIG. 1 is a block diagram illustrating a semiconductor memory device 10 according to an embodiment of the present disclosure.

Referring to FIG. 1, the semiconductor memory device 10 includes a peripheral circuit PC and a memory cell array 20.

The peripheral circuit PC may be configured to control a program operation for storing data in the memory cell array 20, a read operation for outputting data stored in the memory cell array 20, and an erase operation for erasing data stored in the memory cell array 20.

As an embodiment, the peripheral circuit PC may include a voltage generator 31, a row decoder 33, a control circuit 35, and a page buffer group 37.

The memory cell array 20 may include a plurality of memory blocks. The memory cell array 20 may be connected to the row decoder 33 through word lines WL, and may be connected to the page buffer group 37 through bit lines BL.

The control circuit 35 may control the voltage generator 31, the row decoder 33, and the page buffer group 37 in response to a command CMD and an address ADD.

The voltage generator 31 may generate various operation voltages such as an erase voltage, a ground voltage, a program voltage, a verify voltage, a pass voltage, and a read voltage used for the program operation, the read operation, and the erase operation in response to the control of the control circuit 35.

The row decoder 33 may select a memory block in response to the control of the control circuit 35. The row decoder 33 may be configured to apply the operation voltages to the word lines WL connected to the selected memory block.

The page buffer group 37 may be connected to the memory cell array 20 through the bit lines BL. The page buffer group 37 may temporarily store data received from an input/output circuit (not shown) during the program operation in response to the control of the control circuit 35. The page buffer group 37 may sense a voltage or a current of the bit lines BL during the read operation or a verify operation in response to the control of the control circuit 35. The page buffer group 37 may select the bit lines BL in response to the control of the control circuit 35.

Structurally, the memory cell array 20 may overlap a portion of the peripheral circuit PC.

Figure 2:
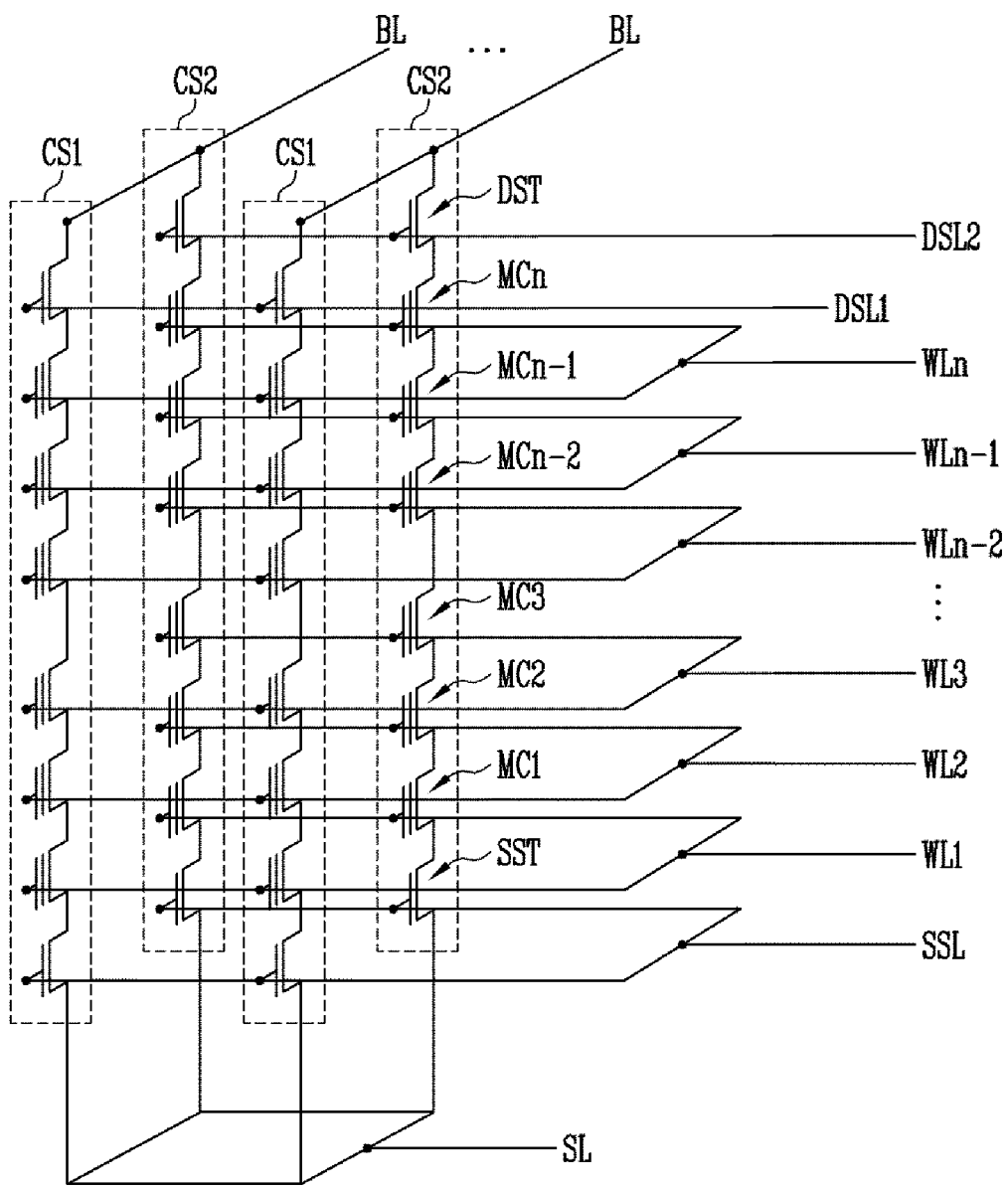
FIG. 2 is a circuit diagram illustrating a memory cell array of FIG. 1.

FIG. 2 is a circuit diagram illustrating the memory cell array 20 of FIG. 1.

Referring to FIG. 2, the memory cell array 20 may include a plurality of cell strings CS1 and CS2 connected between a source line SL and a plurality of bit lines BL. The plurality of cell strings CS1 and CS2 may be commonly connected to a plurality of word lines WL1 to WLn.

Each of the plurality of cell strings CS1 and CS2 may include at least one source select transistor SST connected to the source line SL, at least one drain select transistor DST connected to the bit line BL, and a plurality of memory cells MC1 to MCn connected in series between the source select transistor SST and the drain select transistor DST.

Gates of the plurality of memory cells MC1 to MCn may be respectively connected to the plurality of word lines WL1 to WLn that are spaced apart from each other and stacked. The plurality of word lines WL1 to WLn may be disposed between a source select line SSL and two or more drain select lines DSL1 and DSL2. The two or more drain select lines DSL1 and DSL2 may be spaced apart from each other at the same level.

A gate of the source select transistor SST may be connected to the source select line SSL. A gate of the dram select transistor DST may be connected to a drain select line corresponding to the gate of the drain select transistor DST.

The source line SL may be connected to a source of the source select transistor SST. A drain of the drain select transistor DST may be connected to a bit line corresponding to the drain of the drain select transistor DST.

The plurality of cell strings CS1 and CS2 may be divided into string groups respectively connected to the two or more drain select lines DSL1 and DSL2. Cell strings connected to the same word line and the same bit line may be independently controlled by different drain select lines. In addition, cell strings connected to the same drain select line may be independently controlled by different bit lines.

As an embodiment, the two or more drain select lines DSL1 and DSL2 may include a first drain select line DSL1 and a second drain select line DSL2. The plurality of cell strings CS1 and CS2 may include a first cell string CS1 of a first string group connected to the first drain select line DSL1 and a second string CS2 of a second string group connected to the second drain select line DSL2.

Figure 3:
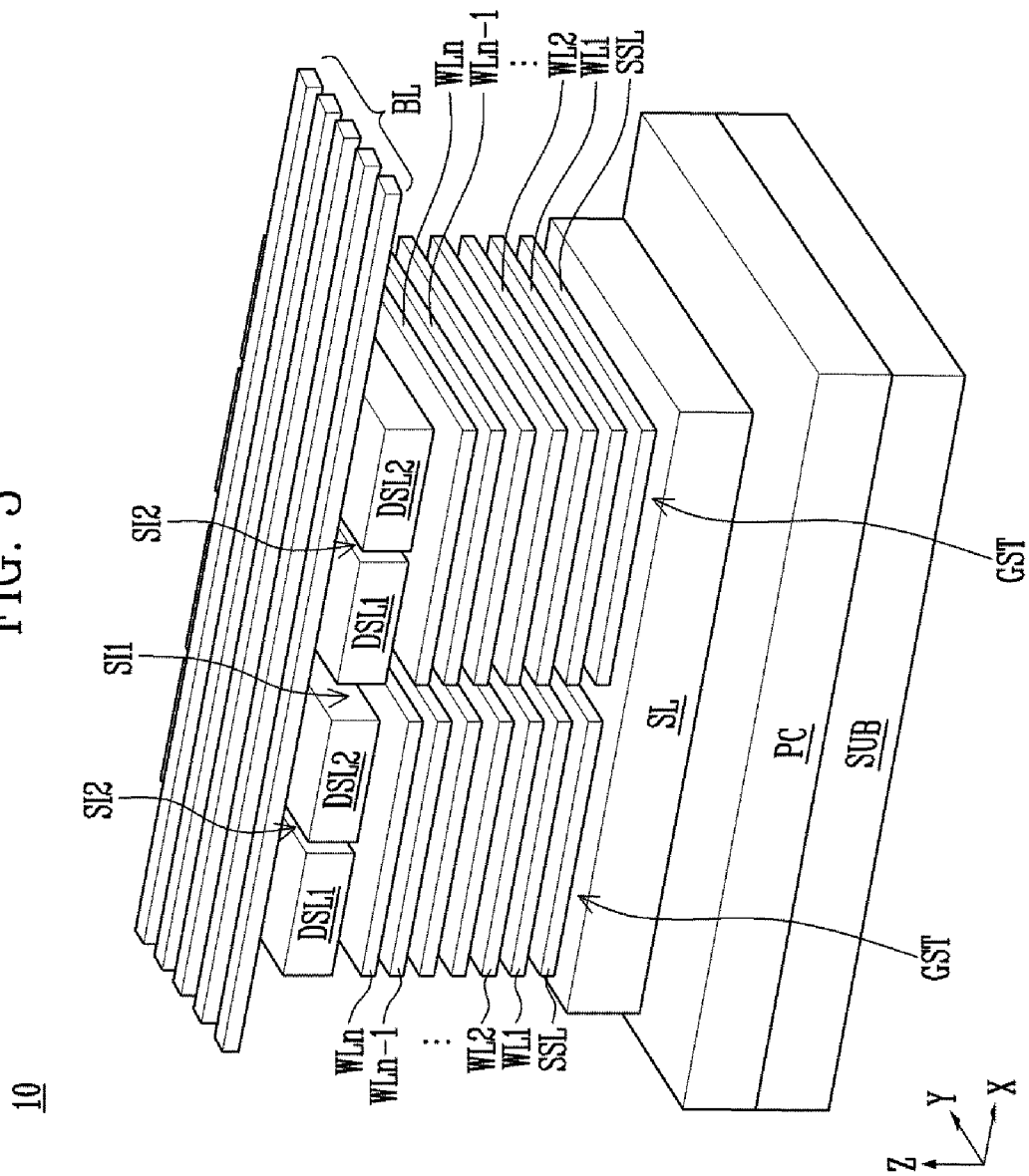
FIG. 3 is a perspective view schematically illustrating a semiconductor memory device according to an embodiment of the present disclosure.

FIG. 3 is a perspective view schematically illustrating a semiconductor memory device 10 according to embodiments of the present disclosure.

Referring to FIG. 3, the semiconductor memory device 10 may include the peripheral circuit PC disposed on a substrate SUB and gate stacks GST overlapping the peripheral circuit PC.

Each of the gate stacks GST may include the source select line SSL, the plurality of word lines WL1 to WLn, and the two or more drain select lines DSL1 and DSL2 separated from each other at the same level by a second slit SI2.

The source select line SSL and the plurality of word lines WL1 to WLn may extend in a first direction X and a second direction Y, and may be formed in a flat plate shape parallel to an upper surface of the substrate SUB. The first direction X may be a direction in which an X-axis of an XYZ coordinate system is directed, and the second direction Y may be a direction in which a Y-axis of the XYZ coordinate system is directed. In FIG. 3, one source select line SSL is disposed in one gate stack GST, but one gate stack GST may include at least one source select line SSL stacked in a third direction Z.

The plurality of word lines WL1 to WLn may be spaced apart from each other and stacked in the third direction Z. The third direction Z may be a direction in which a Z-axis of the XYZ coordinate system is directed. The plurality of word lines WL1 to WLn may be disposed between the two or more drain select lines DSL1 and DSL2 and the source select line SSL.

The gate stacks GST may be separated from each other by a first slit SI1. The second slit SI2 may be formed shorter in the third direction Z than the first slit SI1 and may overlap the plurality of word lines WL1 to WLn.

Each of the first slit SI1 and the second slit SI2 may extend in a straight line shape, a zigzag shape, or a wave shape, Widths of each of the first slit SI1 and the second slit SI2 may differ according to design.

The source select line SSL according to an embodiment may be disposed closer to the peripheral circuit PC than the two or more drain select lines DSL1 and DSL2.

The semiconductor memory device 10 may include the source line SL disposed between the gate stacks GST and the peripheral circuit PC, and the plurality of bit lines BL spaced farther from the peripheral circuit PC than the source line SL. The gate stacks GST may be disposed between the plurality of bit lines BL and the source line SL.

Figure 4:
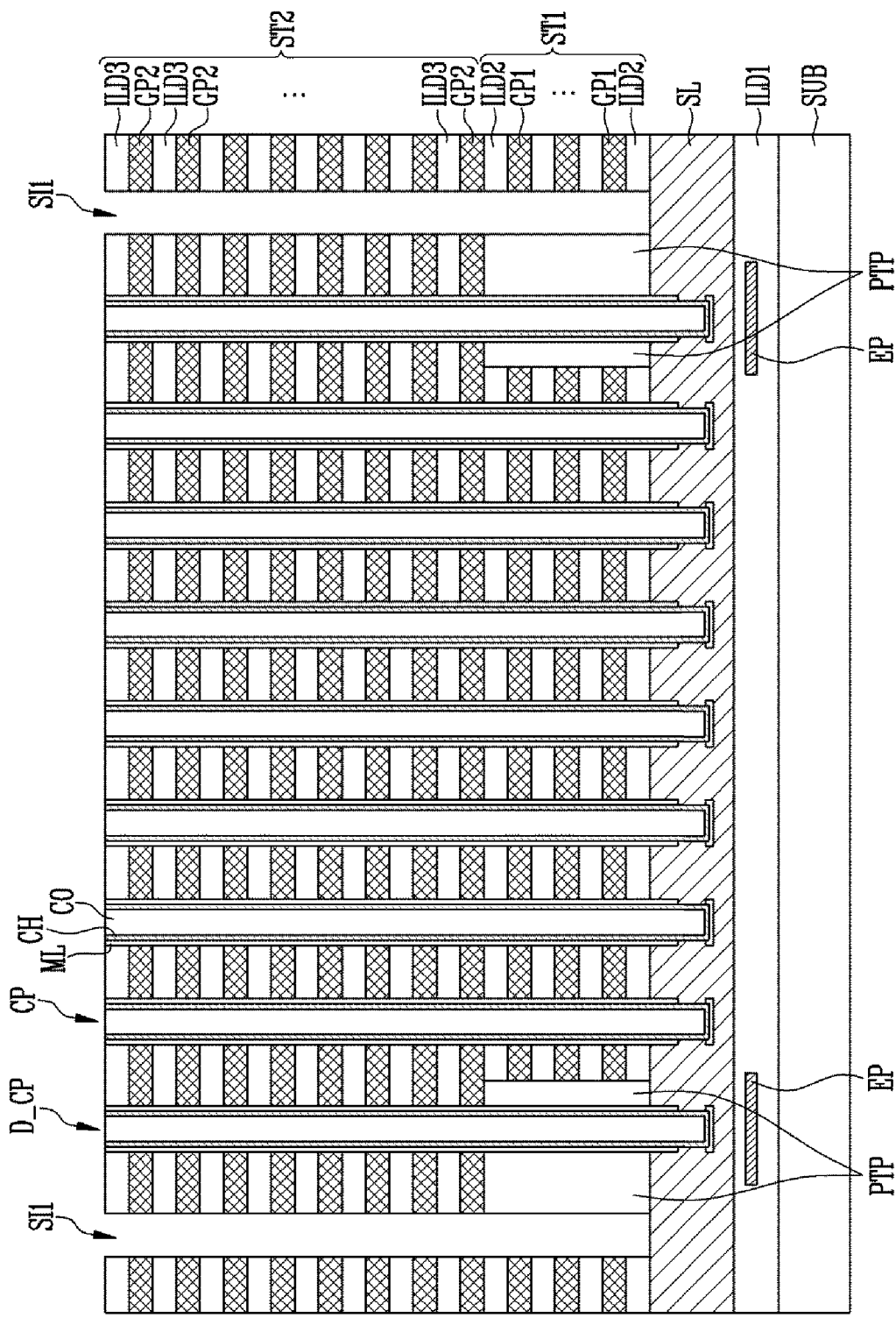
FIG. 4 is a cross-sectional view of a semiconductor memory device illustrating a portion of a memory cell array of the semiconductor memory device according to an embodiment of the present disclosure.

FIG. 4 is a cross-sectional view of a semiconductor memory device illustrating a portion of a memory cell array of the semiconductor memory device according to an embodiment of the present disclosure.

Referring to FIG. 4, the semiconductor memory device may include a source layer SL, a first stack ST1, a second stack ST2, a plurality of cell plugs CP, a plurality of dummy cell plugs D_CP, and the first slit SI1.

The source layer SL may be disposed on the substrate SUB and may include a conductive material. For example, the source layer SL may be configured of a single layer or a plurality of layers. For example, the source layer SL may include polysilicon.

The substrate SUB may be a single crystal semiconductor substrate. For example, the substrate SUB may be a bulk silicon substrate, a silicon-on-insulator substrate, a germanium substrate, a germanium-on-insulator substrate, a silicon-germanium substrate, or an epitaxial thin film formed through a selective epitaxial growth method.

The first stack ST1 may be disposed on the source layer SL and may include a plurality of second interlayer insulating layers ILD2 and a plurality of first gate patterns GP1 alternately stacked. The plurality of first gate patterns GP1 may be gate electrodes of source select transistors or may be a source select line. The first gate patterns GP1 may include a conductive material such as polysilicon, tungsten, molybdenum, or a metal. The plurality of second interlayer insulating layers ILD2 may be for insulating the plurality of stacked first gate patterns GP1 from each other. The plurality of second interlayer insulating layers ILD2 may include an insulating material such as an oxide, nitride, or an air gap.

The second stack ST2 may be disposed on the first stack ST1 and may include a plurality of second gate patterns GP2 and third interlayer insulating layers ILD3 alternately stacked. The plurality of second gate patterns GP2 may be gate electrodes of memory cells or a word line, and may be gate electrodes of drain select transistors or a drain select line. The second gate patterns GP2 may include a conductive material such as polysilicon, tungsten, molybdenum, or a metal. The plurality of third interlayer insulating layers ILD3 may be for insulating the plurality of stacked second gate patterns GP2 from each other. The plurality of third interlayer insulating layers ILD3 may include an insulating material such as an oxide, nitride, or an air gap.

The plurality of cell plugs CP and the plurality of dummy cell plugs D_CP pass through the second stack ST2 and the first stack ST1 and extend into the source layer SL. The plurality of cell plugs CP and the plurality of dummy cell plugs D_CP may be disposed between the first slits SI1 passing through the second and first stacks ST2 and ST1. The plurality of dummy cell plugs D_CP may be disposed relatively adjacent to the first slits SI1.

Each of the plurality of cell plugs CP and the plurality of dummy cell plugs D_CP may include a core insulating layer CO extending in a vertical direction, a channel layer CH surrounding a sidewall and a lower surface of the core insulating layer CO, and a memory layer ML surrounding a sidewall and a lower surface of the channel layer CH. The memory layer ML may expose a sidewall of a portion of the channel layer CH in the source layer SL, and thus a portion of the sidewall of the channel layer CH may contact the source layer SL.

A protective pattern PTP is disposed between the first stack ST1 and the plurality of dummy cell plugs D_CP. In addition, the protective pattern PTP may be disposed in a region defined between the first slit SI1 and the plurality of dummy cell plugs D_CP and between the source layer SL and the second stack ST2. The protective pattern PTP may be disposed between the first slit SI1 and the plurality of dummy cell plugs D_CP by the height of the first stack ST1.

During an etching process of the first stack ST1 and the second stack ST2 for forming the first slit SI1, the lower portion of the first slit SI1 may be bent and etched in a direction in which the plurality of dummy cell plugs D_CP are disposed due to a density difference of patterns. The protective pattern PTP may be disposed in a space where the first stack ST1 is removed in a region where the plurality of dummy cell plugs D_CP are formed and the first stack ST1 is removed, and thus even though the lower portion of the first slit SI1 is bent and etched, abnormal etching of the plurality of first gate patterns GP1 may be prevented by the protective pattern PTP. Accordingly, a bridge phenomenon due to a pattern defect of the plurality of first gate patterns GP1 may be prevented from occurring in advance.

A first interlayer insulating layer ILD1 including an etch stop pattern EP may be disposed between the substrate SUB and the source layer SL. The etch stop pattern EP may be disposed under the plurality of dummy cell plugs D_CP, and may prevent the peripheral circuit PC of FIG. 3 from being damaged due to excessive etching in an etching process for forming the plurality of dummy cell plugs D_CP.

FIGS. 5A to 5I are cross-sectional views and plan views of a semiconductor memory device illustrating a method of manufacturing the semiconductor memory device according to an embodiment of the present disclosure.

The manufacturing method described below is only one possible method of manufacturing the semiconductor memory device according to FIG. 4, and the method of manufacturing the semiconductor memory device according to FIG. 4 is not limited to the manufacturing method described below.

Figure 5A:
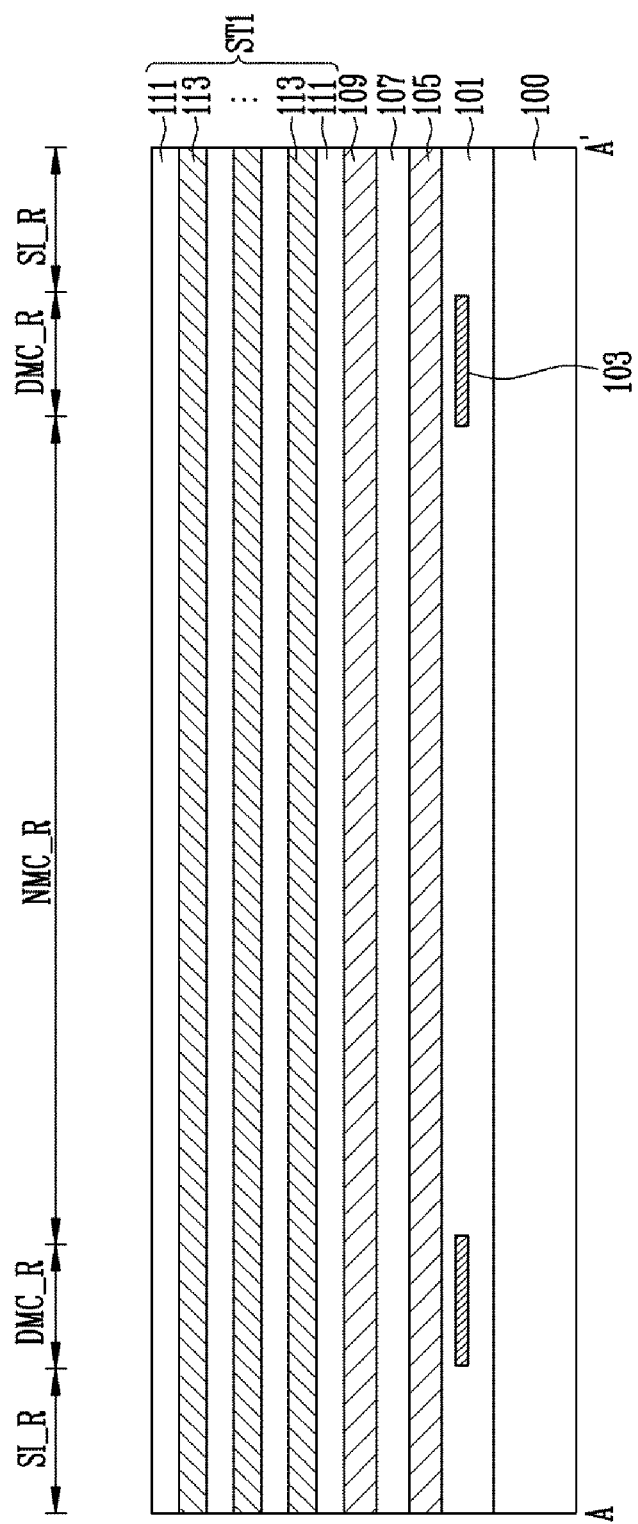

Referring to FIG. 5A, a first interlayer insulating layer 101 is formed on a semiconductor substrate 100 on which a lower structure (not shown) is formed. The lower structure (not shown) may include transistors, resistors, capacitors, and a plurality of wires included in the peripheral circuit PC of FIG. 3.

For example, the first interlayer insulating layer 101 is formed on the semiconductor substrate 100 defined as a normal cell plug region NMC_R, a dummy cell plug region DMC_R, and a slit region SI_R. The first interlayer insulating layer 101 may be formed of an oxide layer. An etch stop pattern 103 may be formed in the first interlayer insulating layer 101. The etch stop pattern 103 may be disposed in the dummy cell plug region DMC_R.

The normal cell plug region NMC_R may be disposed between the two slit regions SI_R, and the dummy cell plug region DMC_R may be disposed at a boundary between the normal cell plug region NMC_R and one slit region SI_R. The normal cell plug region NMC_R is a region in which the cell plugs CP of FIG. 4 are formed, the dummy cell plug region DMC_R is a region in which the dummy cell plugs D_CP of FIG. 4 are formed, and the slit region SI_R is a region in which the first slit SI1 of FIG. 4 is formed.

Thereafter, a first source layer 105, a source sacrificial structure 107, and a third source layer 109 may be sequentially stacked and formed on the first interlayer insulating layer 101. For example, the first source layer 105 and the third source layer 109 may include polysilicon. For example, the source sacrificial structure 107 may include an oxide or a high-k material.

Subsequently, the first stack ST1 is formed on the third source layer 109. The first stack ST1 may include second interlayer insulating layers 111 and first gate sacrificial layers 113 alternately stacked.

For example, the second interlayer insulating layer 111 may include silicon oxide. The first gate sacrificial layer 113 may include a material having a high etch selectivity with respect to the second interlayer insulating layer 111. For example, the first gate sacrificial layer 113 may include silicon nitride.

Figure 5B:
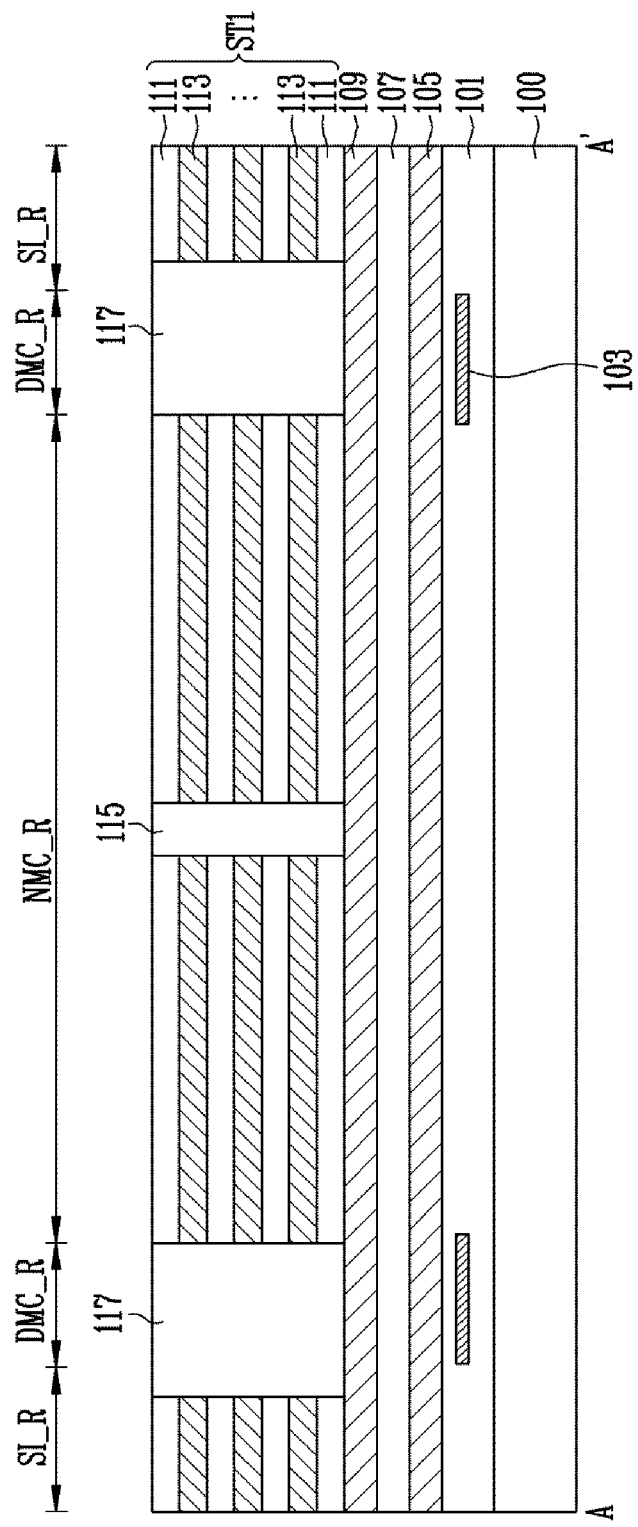
Figure 5C:
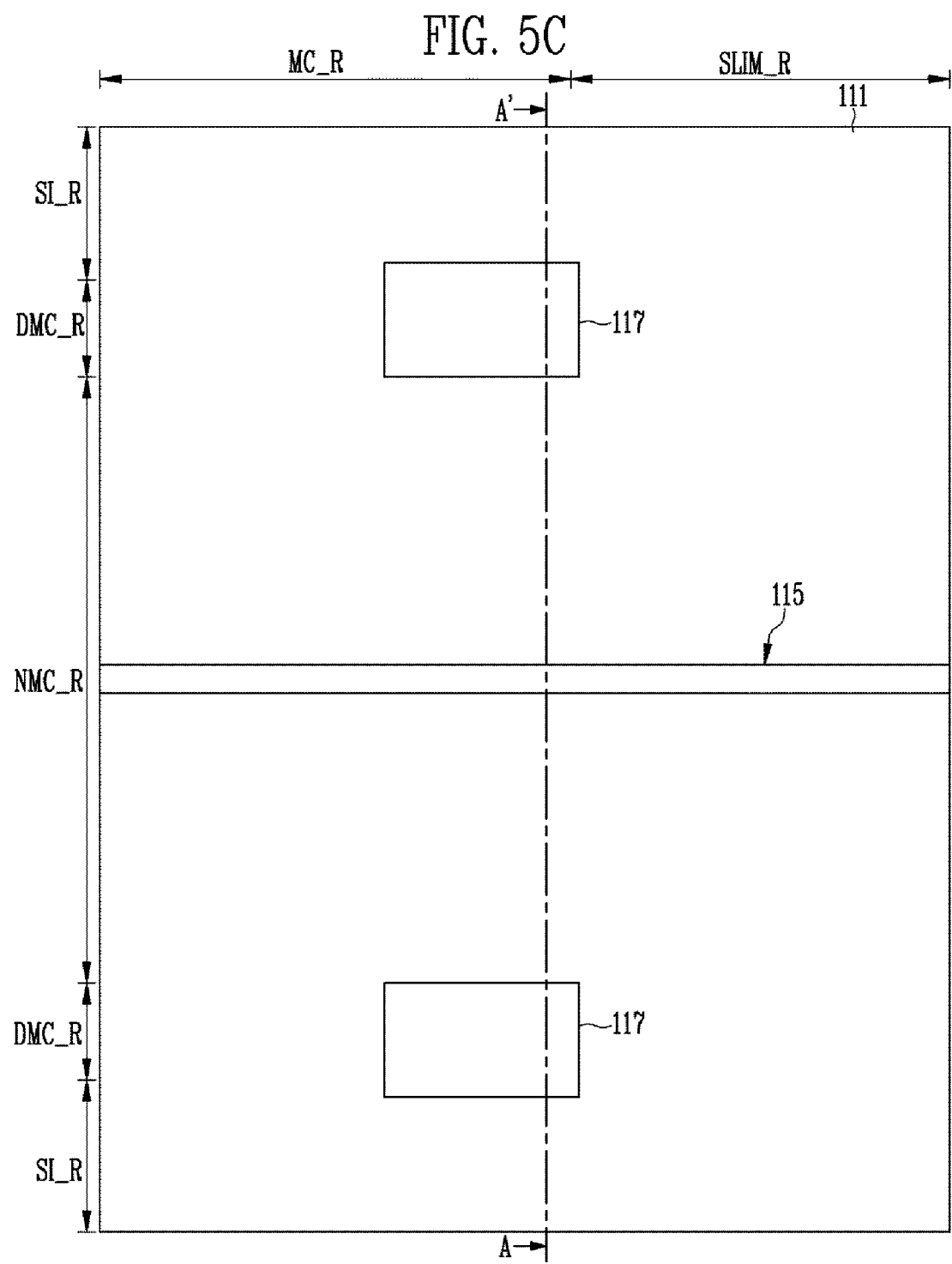

Referring to FIGS. 5B and 5C, a separation pattern 115 for separating a gate pattern for a source select line to be formed subsequently is formed. The separation pattern 115 may be formed in a line shape in a cell region MC_R and a slimming region SLIM_R.

For example, a trench in which the third source layer 109 is exposed is formed by etching the first stack ST1 in a region where the gate pattern for the source select line is to be separated among the cell region MC_R and the slimming region SLIM_R. Thereafter, the separation pattern 115 is formed by filling the trench with an insulating layer including an oxide.

In a process of forming the separation pattern 115 described above, protective patterns 117 may be formed together in a region where the dummy cell plugs are to be formed. For example, the first stack ST1 formed in regions adjacent to the slimming region SLIM_R among the dummy cell plug region DMC_R of the cell region MC_R is removed by etching the first stack. Thereafter, the protective pattern 117 is formed by filling a space where the first stack ST1 is removed with an insulating layer including an oxide.

The protective pattern 117 may be formed in a region adjacent to the slit region SI_R and the slimming region SLIM_R among the dummy cell plug region DMC_R, and a portion of the protective pattern 117 may overlap the slimming region SLIM_R of the slit region SI_R.

Figure 5D:
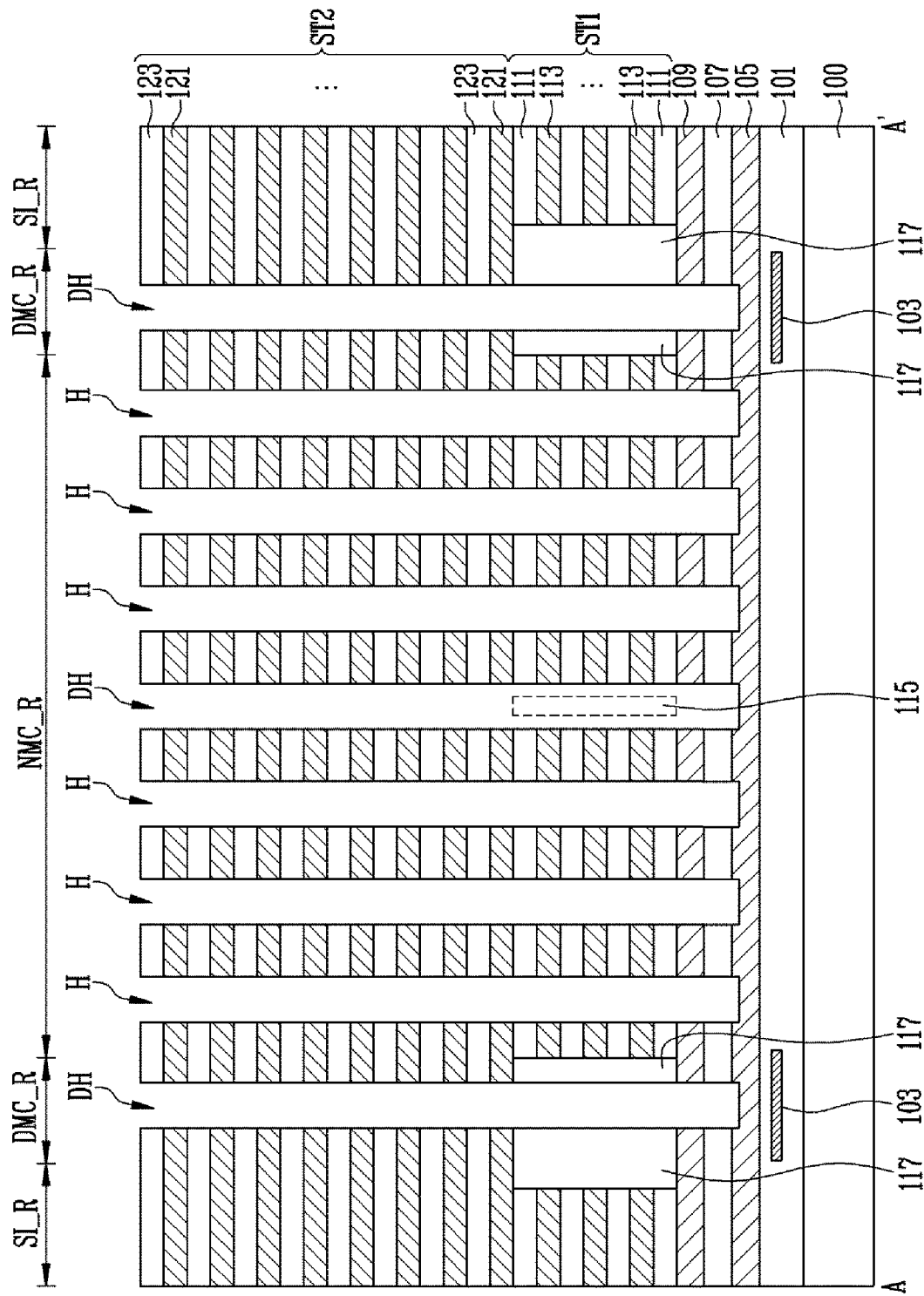

Referring to FIGS. 5D and 5E, the second stack ST2 is formed on the entire structure including the first stack ST1, the separation pattern 115, and the protective pattern 117. The second stack ST2 may include second gate sacrificial layers 121 and third interlayer insulating layers 123 alternately stacked. For example, the third interlayer insulating layer 123 may include silicon oxide. The second gate sacrificial layer 121 may include a material having a high etch selectivity with respect to the third interlayer insulating layer 123. For example, the second gate sacrificial layer 121 may include silicon nitride.

The second gate sacrificial layers 121 of the second stack ST2 may be formed of the same material as the first gate sacrificial layers 113 of the first stack ST1, and the third interlayer insulating layers 123 of the second stack ST2 may be formed of the same material as the second interlayer insulating layers 111 of the first stack ST1.

Thereafter, channel holes H for forming the cell plug passing through the second stack ST2, the first stack ST1, the third source layer 109, and the source sacrificial structure 107 are formed.

In addition, dummy holes DH for forming the dummy cell plugs passing through the second stack ST2, the first stack ST1, the separation pattern 115, the third source layer 109, and the source sacrificial structure 107, and dummy holes DH passing through the second stack ST2, the protective pattern 117, the third source layer 109, and the source sacrificial structure 107 are formed.

Figure 5F:
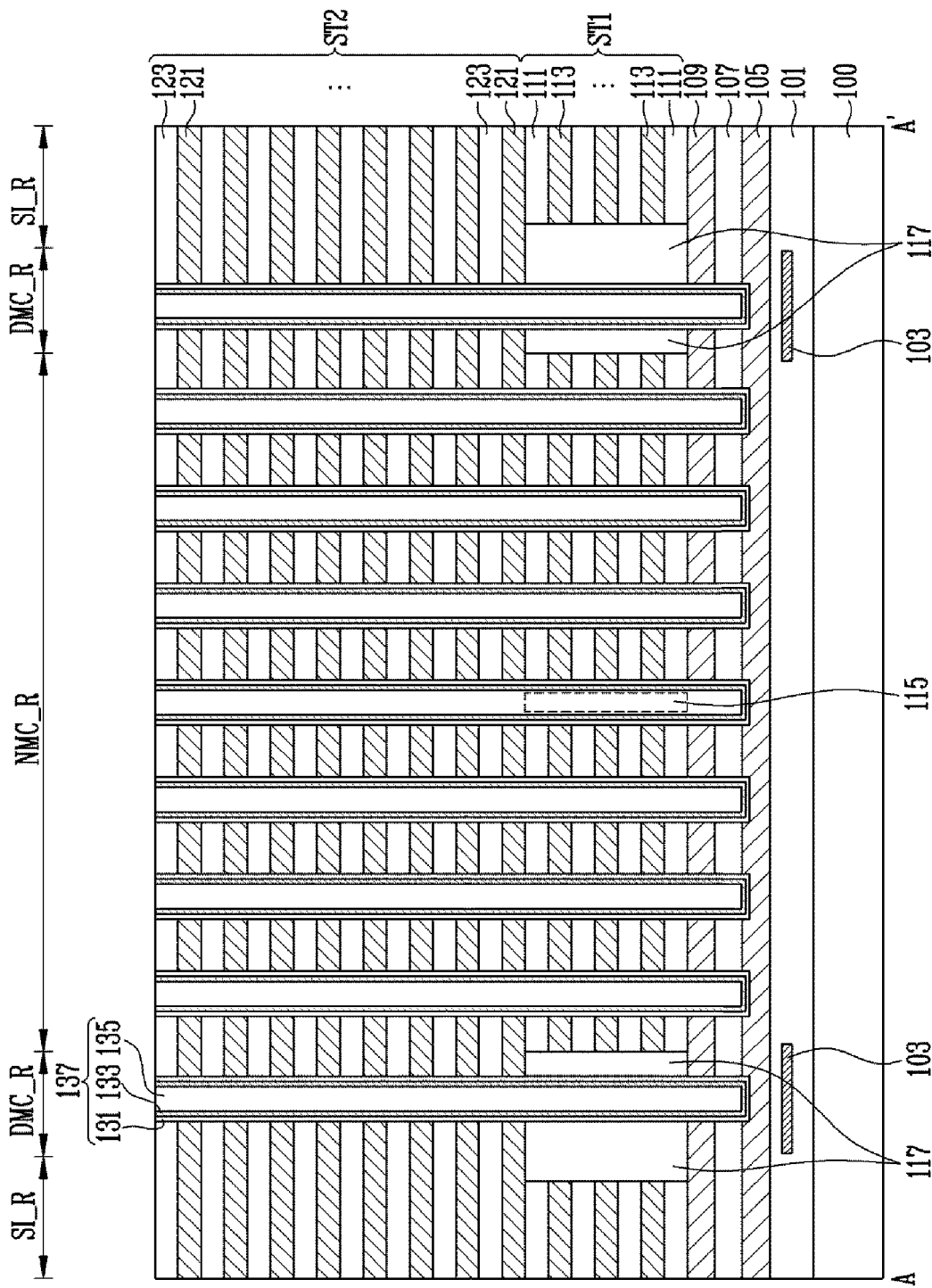

Referring to FIG. 5F, plugs 137 are formed in the channel holes H of FIG. 5E for forming the cell plug and the dummy holes DH of FIG. 5E for forming the dummy cell plug. For example, the plugs 137 may be formed by sequentially stacking a memory layer 131, a channel layer 133, and a core insulating layer 135 on sidewalls of each of the channel holes H and the dummy holes DH.

The memory layer 131 may include a blocking insulating layer, a data storage layer, and a tunnel insulating layer. For example, the memory layer 131 may be formed by sequentially stacking the blocking insulating layer, the data storage layer, and the tunnel insulating layer on the sidewalk of each of the channel holes and the dummy holes. The blocking insulating layer may be formed on the sidewalk of each of the channel holes and the dummy holes. The blocking insulating layer may include an oxide layer capable of charge blocking. As an embodiment, the blocking insulating layer may be formed of aluminum oxide $Al_2O_3$. The data storage layer may be formed on a sidewall of the blocking insulating layer. The data storage layer may be formed of a charge trap layer, a material layer including a conductive nanodot, or a phase-change material layer. For example, the data storage layer may store changed data using Fowler-Nordheim tunneling. To this end, the data storage layer may be formed of a silicon nitride layer capable of charge trapping. The tunnel insulating layer may be formed on a sidewall of the data storage layer. The tunnel insulating layer may be formed of a silicon oxide layer capable of charge tunneling.

The channel layer 133 may be formed on a sidewall of the tunnel insulating layer. The channel layer 133 may include a semiconductor layer. As an embodiment, the channel layer 133 may include silicon.

The core insulating layer 135 may be formed by filling a central region of the channel holes and the dummy holes. The core insulating layer 135 may be formed of an oxide layer.

The plugs 137 filling the channel holes may be defined as the cell plugs, and the plugs 137 filling the dummy holes may be defined as the dummy plugs.

The dummy plugs may include plugs 137 passing through the separation pattern 115 and plugs 137 passing through the protective pattern 117. Because the plugs 137 are formed in the cell region MC_R of FIG. 5E, a density of patterns in the cell region MC_R may be higher than that of patterns in the slimming region SLIM_R.

Figure 5G:
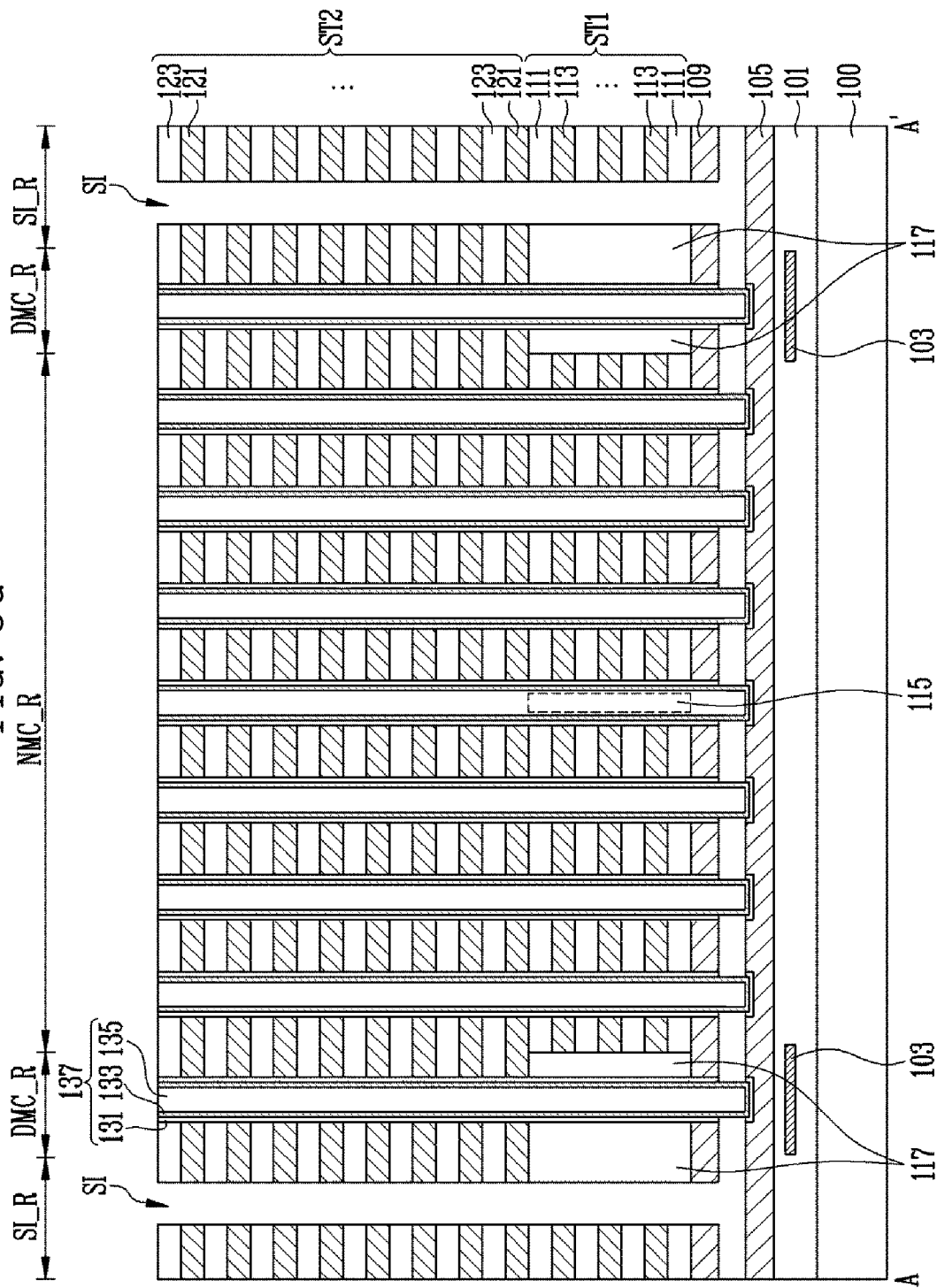

Referring to FIGS. 5G and 5H, a slit SI of a line shape through which the source sacrificial structure 107 of FIG. 5F is exposed may be formed by etching the second stack ST2, the first stack ST1, and the third source layer 109 formed on the slit region SI_R. During a process of forming the slit SI, a lower portion of the slit SI may be bent and etched in a direction of the cell region MC_R due to a density difference in a boundary portion between the cell region MC_R and the slimming region SLIM_R shown in FIG. 5E.

Thereafter, the source sacrificial structure 107 of FIG. 5F exposed by the slit SI is removed. Accordingly, the memory layer 131 may be exposed on a sidewall of a lower end of the plugs 137, and the exposed memory layer 131 is etched to expose the channel layer 133 of the sidewall of the lower end of the plugs 137.

Figure 5I:
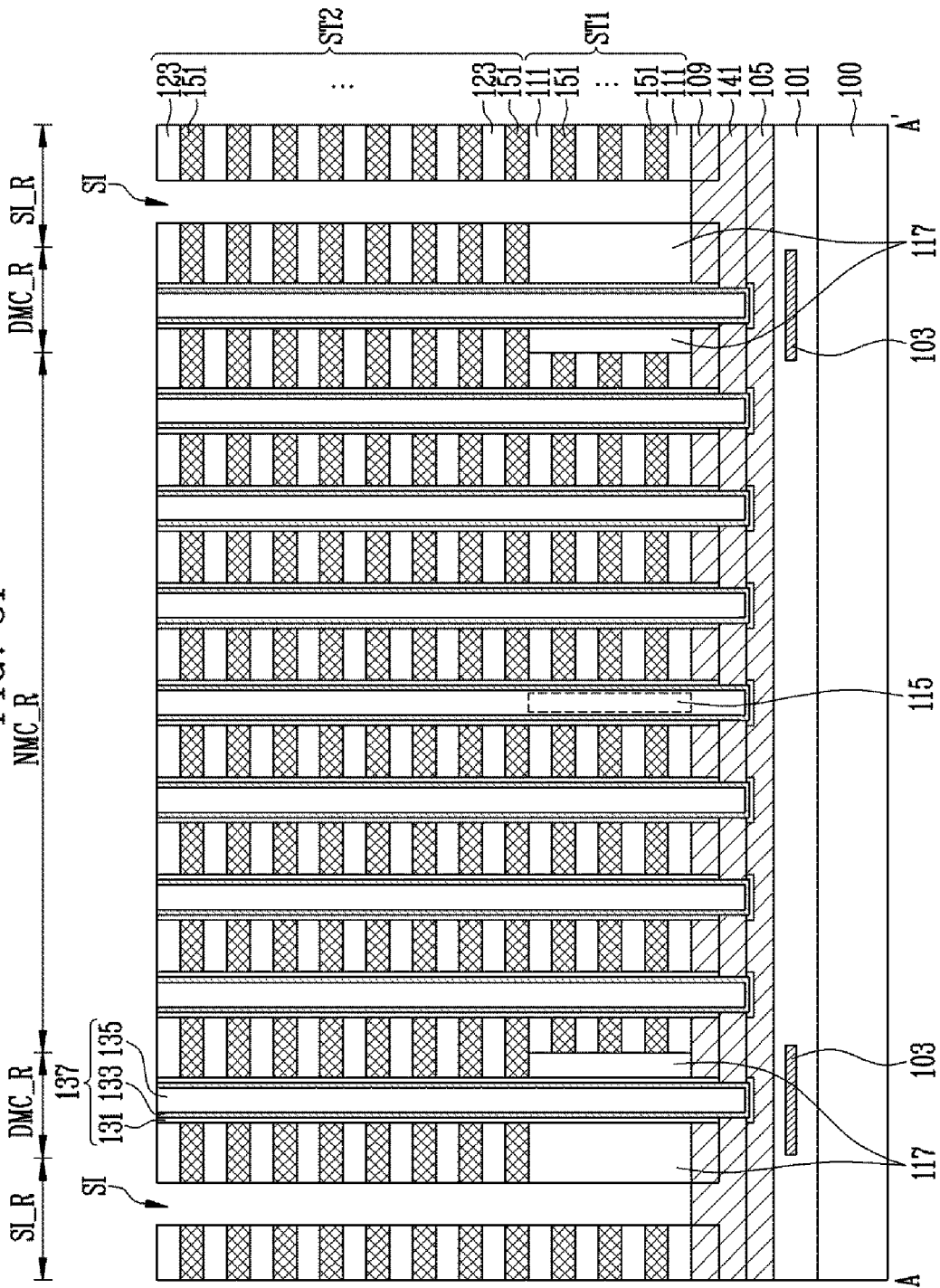

Referring to FIG. 5I, a second source layer 141 is filled in a space where the source sacrificial structure 107 of FIG. 5F is removed. The second source layer 141 may be in contact with the channel layer 133 of the sidewalls of the lower end of the plugs 137.

Thereafter, the first gate sacrificial layers 113 and the second gate sacrificial layers 121 of FIG. 5G exposed through the slit SI are removed, and gate patterns 151 are formed in the created space.

Among the gate patterns 151, the gate patterns 151 included in the first stack ST1, for example, the gate patterns 151 formed in a space between the second interlayer insulating layers 111 may be the gate patterns for the source select transistor. In addition, among the gate patterns 151, the gate patterns 151 included in the second stack ST2, for example, the gate patterns 151 formed in a space between the third interlayer insulating layers 123 may be the gate pattern for the gate pattern for the memory cell and the gate pattern for the drain select transistor.

In the dummy cell plug region DMC_R adjacent to the slit SI adjacent to the boundary portion between the cell region MC_R and the slimming region SLIM_R where the lower portion of the slit SI may be bent and formed during the above-described gate pattern forming process, the first stack ST1 is removed and the protective pattern 117 is formed. Thus, the gate pattern 151 is not formed in a region adjacent to the slit SI. Accordingly, even though the lower portion of the slit SI is bent and formed, a bridge phenomenon due to the gate pattern 151 does not occur.

According to the above-described embodiment, it is described that the dummy cell plug is formed on the dummy cell plug region, and the plurality of cell plugs are formed on the normal memory cell region. However, a dummy cell plug or a plurality of cell plugs may be formed at the boundary between the dummy cell plug region and the normal cell plug region. In addition, at least one of the plurality of cell plugs may be formed on the dummy cell plug region adjacent to the normal memory cell region.

Figure 6:
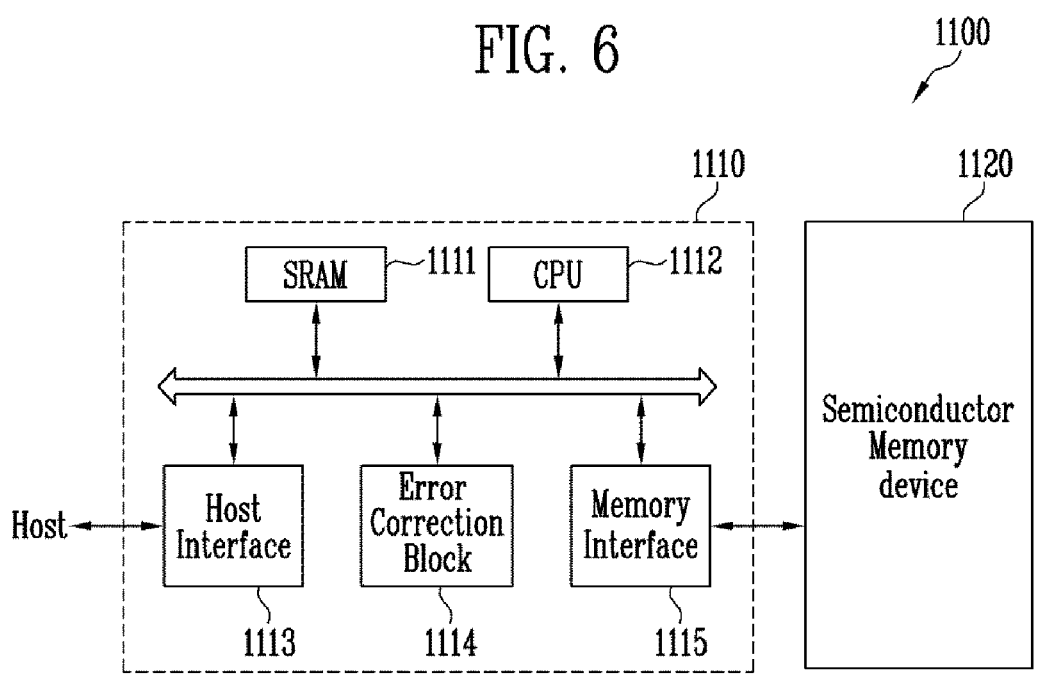
FIG. 6 is a block diagram illustrating a configuration of a memory system according to an embodiment of the present disclosure.

FIG. 6 is a block diagram illustrating a configuration of a memory system 1100 according to an embodiment of the present disclosure.

Referring to FIG. 6, the memory system 1100 includes a semiconductor memory device 1120 and a memory controller 1110.

The semiconductor memory device 1120 may be configured identically to the semiconductor memory device shown in FIGS. 1 to 4.

The semiconductor memory device 1120 may be a multi-chip package configured of a plurality of flash memory chips.

The memory controller 1110 may be configured to control the semiconductor memory device 1120, and may include static random access memory (SRAM) 1111, a central processing unit (CPU) 1112, a host interface 1113, an error correction block 1114, and a memory interface 1115. The SRAM 1111 is used as operation memory of the CPU 1112, the CPU 1112 performs an overall control operation for data exchange of the memory controller 1110, and the host interface 1113 includes a data exchange protocol of a host connected to the memory system 1100. In addition, the error correction block 1114 detects and corrects an error included in data read from the semiconductor memory device 1120, and the memory interface 1115 performs interfacing with the semiconductor memory device 1120. In addition, the memory controller 1110 may further include read only memory (ROM) that stores code data for interfacing with the host.

Figure 7:
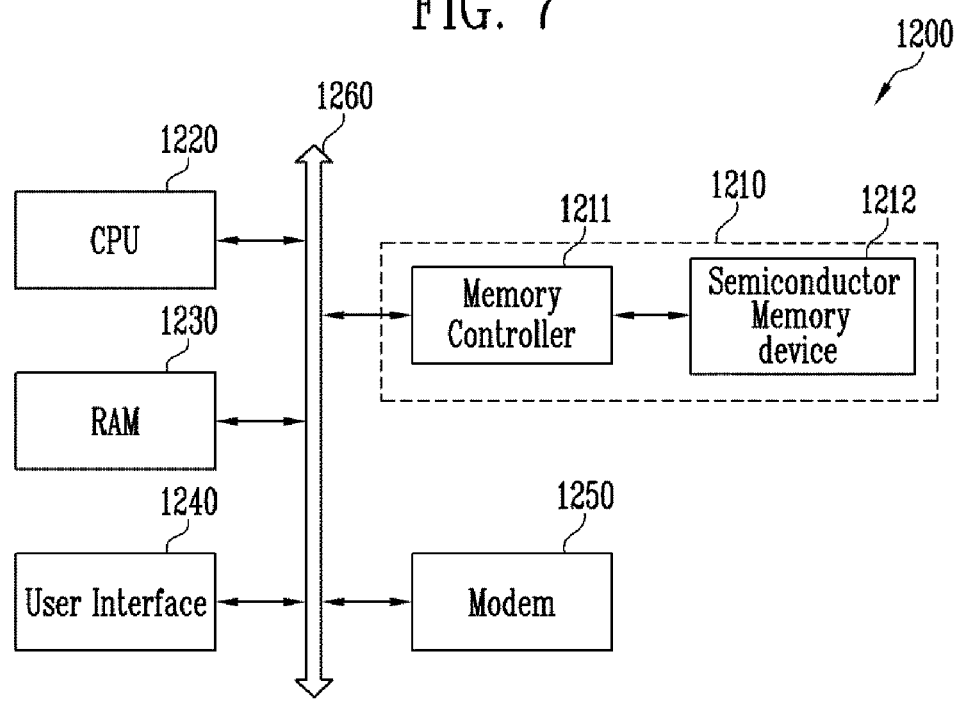
FIG. 7 is a block diagram illustrating a configuration of a computing system according to an embodiment of the present disclosure.

FIG. 7 is a block diagram illustrating a configuration of a computing system 1200 according to an embodiment of the present disclosure.

Referring to FIG. 7, the computing system 1200 may include a CPU 1220, random access memory (RAM) 1230, a user interface 1240, a modem 1250, and a memory system 1210 electrically connected to a system bus 1260. The computing system 1200 may be a mobile device.

The memory system 1210 may include a semiconductor memory device 1212 and a memory controller 1211. The semiconductor memory device 1212 may be configured identically to the semiconductor memory device shown in FIGS. 1 to 4.

Although the detailed description of the present disclosure describes specific embodiments, various changes and modifications are possible without departing from the scope and technical spirit of the present disclosure. Therefore, the scope of the present disclosure should not be limited to the above-described embodiments, and should be determined by the equivalents of the claims of the present disclosure as well as the following claims.

What is claimed is:
1. A semiconductor memory device, comprising:
a first stack and a second stack stacked on a semiconductor substrate of a cell region of the semiconductor memory device and a slit region of the semiconductor memory device adjacent to the cell region in a first direction;
a plurality of cell plugs at least partially passing through the second stack and the first stack in the cell region and extending in a vertical direction;
dummy cell plugs at least partially passing through the second stack and the first stack in an area of the cell region which is adjacent to the slit region;
a slit at least partially passing through the second stack and the first stack in the slit region; and a protective pattern passing through the first stack in the area and disposed between the slit and one of the dummy cell plugs, wherein each of the plurality of cell plugs and the dummy cell plugs includes a memory layer and a channel layer, wherein the first stack includes at least one second interlayer insulating layer and at least one first gate pattern alternately stacked, and the second stack includes a plurality of third interlayer insulating layers and a plurality of second gate patterns alternately stacked, and wherein a sidewall of the protective pattern and a sidewall of the at least one first gate pattern are in contact with each other.

2. The semiconductor memory device of claim 1, wherein the protective pattern is disposed between the dummy cell plugs and the slit by a height of the first stack.

3. The semiconductor memory device of claim 1, further comprising:
a source layer disposed between the semiconductor substrate and the first stack.

4. The semiconductor memory device of claim 3, wherein the protective pattern is disposed:
between the dummy cell plugs and the slit; and
between the second stack and the source layer.

5. The semiconductor memory device of claim 3, further comprising:
a first interlayer insulating layer disposed between the semiconductor substrate and the source layer; and
an etch stop pattern disposed in the first interlayer insulating layer under the dummy cell plugs.

6. The semiconductor memory device of claim 1, wherein the at least one first gate pattern includes a gate pattern for a source select transistor and a source select line.

7. The semiconductor memory device of claim 1, wherein the plurality of second gate patterns include gate patterns for a memory cell and a word line.

8. The semiconductor memory device of wherein the protective pattern is disposed in a region of the semiconductor memory device adjacent to the slit and a slimming region of the semiconductor memory device, and the slimming region is adjacent to the cell region in a second direction orthogonal to the first direction.

* * * * *